(12) United States Patent
Lee et al.

(10) Patent No.: US 12,237,836 B2
(45) Date of Patent: Feb. 25, 2025

(54) SIGNAL CHATTER MITIGATION

(71) Applicant: TEXAS INSTRUMENTS INCORPORATED, Dallas, TX (US)

(72) Inventors: Kyoung Min Lee, Cary, NC (US); Satish Kumar Vemuri, Raleigh, NC (US); Zhidong Liu, Cary, NC (US); Maxim James Franke, Dallas, TX (US); Kory Andrew McCarthy, Cary, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/710,533

(22) Filed: Mar. 31, 2022

(65) Prior Publication Data

US 2023/0318588 A1 Oct. 5, 2023

(51) Int. Cl.
*H03K 5/00* (2006.01)
*H03K 3/012* (2006.01)
*H03K 5/1252* (2006.01)

(52) U.S. Cl.
CPC ........... *H03K 5/1252* (2013.01); *H03K 3/012* (2013.01)

(58) Field of Classification Search
CPC .... H03K 5/1252; H03K 3/012; H03K 3/0375; H03K 17/223
See application file for complete search history.

(56) References Cited

U.S. PATENT DOCUMENTS

| | | | | |
|---|---|---|---|---|
| 5,341,033 A * | 8/1994 | Koker | ..................... | H03K 3/013 327/384 |
| 5,479,132 A * | 12/1995 | Verhaeghe | ........... | H03K 5/1252 327/198 |
| 6,307,423 B1 * | 10/2001 | Morton | .................. | G11C 17/16 365/96 |
| 6,894,540 B1 * | 5/2005 | Ali | ........................ | H03K 5/1252 327/551 |
| 6,998,770 B2 * | 2/2006 | Chae | ......................... | G09G 3/32 313/500 |
| 7,397,292 B1 * | 7/2008 | Potanin | ................ | H03K 5/1252 327/552 |
| 8,674,740 B2 * | 3/2014 | Heo | ........................ | H03K 5/133 327/551 |
| 2004/0095173 A1 * | 5/2004 | Lee | ....................... | H03K 17/223 327/143 |
| 2007/0052449 A1 * | 3/2007 | Kimura | ................ | H03K 5/1252 327/34 |

(Continued)

FOREIGN PATENT DOCUMENTS

JP 57-192110 * 11/1982

*Primary Examiner* — Tuan T Lam
(74) *Attorney, Agent, or Firm* — Ray A. King; Frank D. Cimino

(57) ABSTRACT

In some examples, a circuit includes a capacitor having a first terminal and a second terminal, the first terminal coupled to a voltage supply terminal of the circuit. The circuit also includes a transistor having a transistor gate, a transistor drain, and a transistor source, the transistor source coupled to ground and the transistor drain coupled to an input terminal of the circuit. The transistor is configured to conduct responsive to a gate signal received at the transistor gate, the gate signal based on a signal provided at the second terminal of the capacitor. The circuit also includes a Schmitt trigger having a Schmitt trigger input coupled to the transistor drain.

8 Claims, 7 Drawing Sheets

(56) References Cited

U.S. PATENT DOCUMENTS

2011/0074470 A1\* 3/2011 Sanborn ............... H03K 17/223
327/143
2016/0329885 A1\* 11/2016 Ma ........................ H03K 5/159

\* cited by examiner

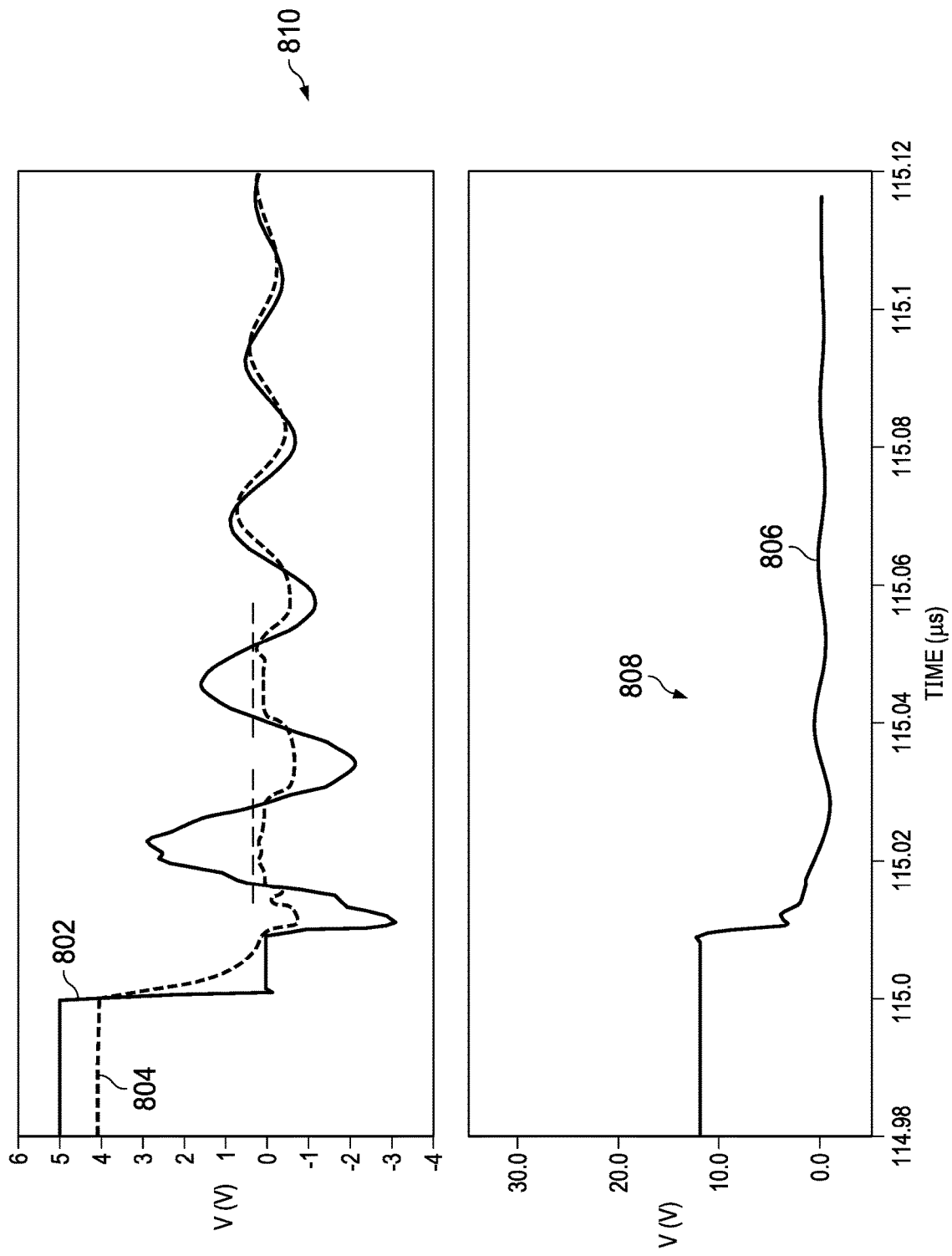

SIGNAL CHATTER MITIGATION

BACKGROUND

Integrated circuits are encased in packages to protect the integrated circuits from damage and facilitate coupling to the integrated circuit. Conductive elements of the integrated circuits, such as pads, are coupled to conductive components, such as lead pins, that are exposed outside the package to facilitate coupling of other components to the integrated circuit. The pads are coupled to the lead pins via bond wires. The bond wires and/or the lead pins may have parasitic characteristics, such as inductance, that may affect an actual or perceived value of signals conveyed via the bond wires and/or the lead pins.

SUMMARY

In some examples, a circuit includes a capacitor having a first terminal and a second terminal, the first terminal coupled to a voltage supply terminal of the circuit. The circuit also includes a transistor having a transistor gate, a transistor drain, and a transistor source, the transistor source coupled to ground and the transistor drain coupled to an input terminal of the circuit. The transistor is configured to conduct responsive to a gate signal received at the transistor gate, the gate signal based on a signal provided at the second terminal of the capacitor. The circuit also includes a Schmitt trigger having a Schmitt trigger input coupled to the transistor drain.

In some examples, a circuit is configured to detect a change in voltage provided at a first pad of the circuit while providing an output signal having a first logical state, and responsive to the change in voltage exceeding a threshold rate of change and the voltage having a value sufficient to cause the output signal to have a second logical state, hold the output signal at the first logical state.

In some examples, a system includes a gate driver and a transistor. The gate driver includes a Schmitt trigger, a chatter suppression circuit, a logic circuit, and a driver. The Schmitt trigger has a Schmitt trigger input and a Schmitt trigger output. The chatter suppression circuit is coupled to the Schmitt trigger input and the Schmitt trigger output. The chatter suppression circuit is configured to control a value of a signal provided at the Schmitt trigger output, irrespective of a change in value of an input signal received by the gate driver, based on a detected change in value of a voltage supply of the gate driver. The logic circuit has a logic circuit input and a logic circuit output. The logic circuit input is coupled to the Schmitt trigger output. The driver has a driver input and a driver output. The driver input is coupled to the logic circuit output. The transistor has a transistor gate coupled to the output of the driver.

BRIEF DESCRIPTION OF THE DRAWINGS

FIG. 8B is a timing diagram of signals in an electronic device, in accordance with various examples.

DETAILED DESCRIPTION

As described above, parasitic characteristics of bond wires and/or lead pins may affect signals that are conveyed by an integrated circuit via the bond wires and/or lead pins. For example, inductances of these elements may cause a glitch or chatter to be provided in a signal conveyed via a respective bond wire and/or lead pin. Such a glitch can be caused due to noise on a ground plane of the integrated circuit (e.g., as may also be provided at a ground lead pin coupled to the integrated circuit) causing a voltage provided on the ground plane to vary in value. This variation may be an increase in value or a decrease in value. For signals that are referenced to the ground plane (e.g., the signal is determined to represent a first unit if the signal has a first value with respect to ground and represent a second unit if the signal has a second value with respect to ground), the variation in value of the voltage provided on the ground plane may cause the signal to be misinterpreted.

Examples of this description mitigate the creation of glitches and/or chatter in a signal due to noise on a ground plane. Some approaches may exist for reducing the effects of noise on the ground plane on signals in a system, but these approaches may add additional pins to a package that includes an integrated circuit that provides the signals, and/or increase a propagation delay of signals of the integrated circuit beyond levels deemed suitable for market competitiveness. Circuits of this description detect changes in voltage of a pad or multiple pads of an integrated circuit package and, responsive to the voltage provided at the pad changing more than a programmed amount, or multiple pads changing in a same direction (e.g., increase or decrease in value), determine the change to be attributed to noise on the ground plane. Responsive to such a determination, the circuits may hold a value of an output signal at a value provided prior to the detected change in voltage, mitigating the providing of glitch or chatter outputs of the integrated circuit due to the noise on the ground plane.

Figure 1:
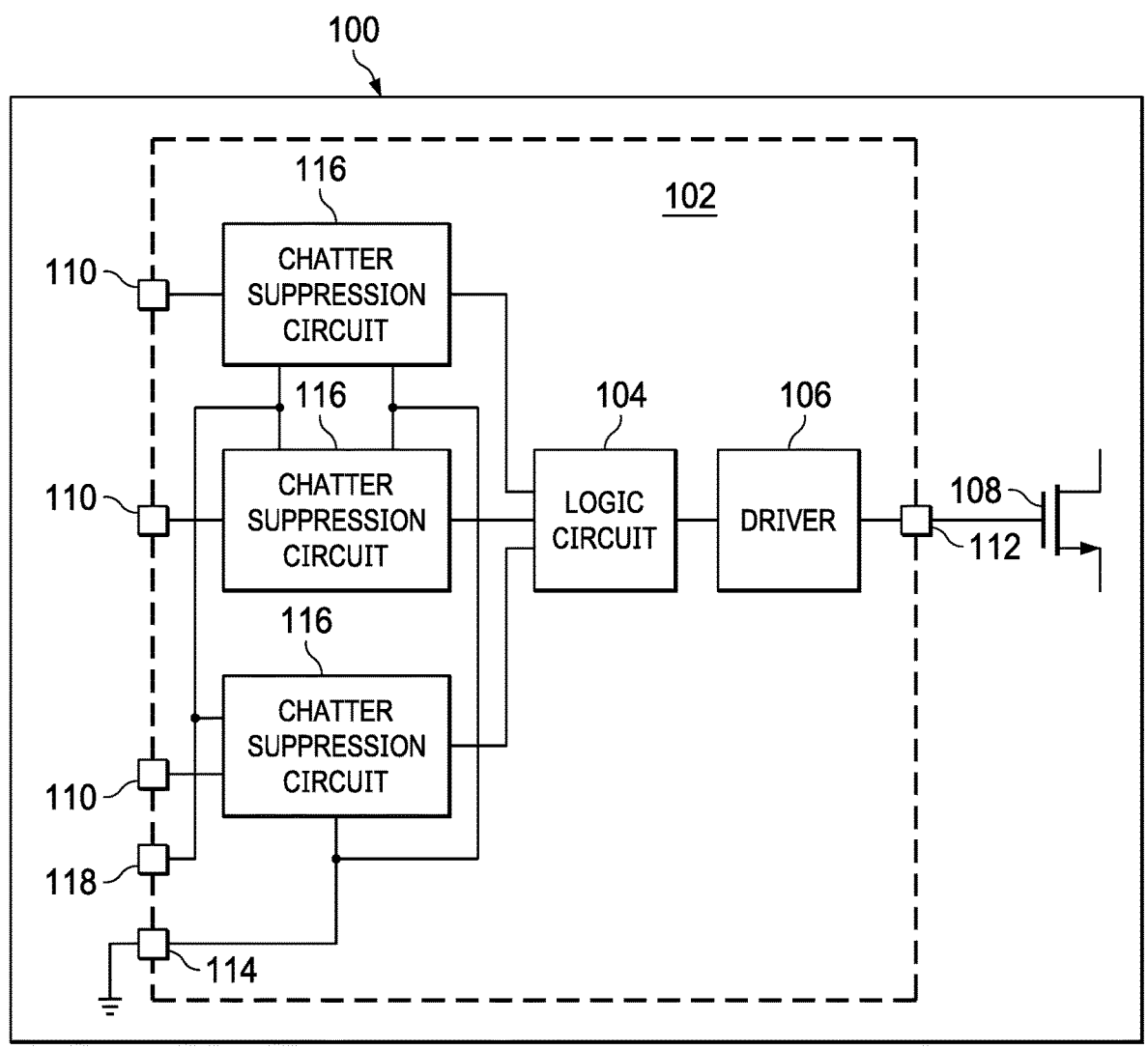
FIG. 1 is a block diagram of an electronic device, in accordance with various examples.

FIG. 1 is a block diagram of an electronic device 100, in accordance with various examples. In various examples, the electronic device 100 is representative of a power converter, a signal driver, or another device. Generally, the electronic device 100 is any device that includes a gate driver 102 having a logic circuit 104, a driver 106, and includes, or is adapted to be coupled to, a transistor 108. For example, the logic circuit 104 may include, be coupled to, or be adapted to be coupled to, multiple input pads 110 and to be coupled at an output to the driver 106. The driver 106 may be coupled at an output, in some implementations through an output pad 112, to a gate of the transistor 108. The gate driver 102 may be coupled at a ground pad 114 to ground such that a ground voltage potential is provided.

As described above, a value provided at the ground pad 114 may vary in value, potentially causing glitches, chatter, or other adverse effects in an output provided at the output pad 112. To mitigate these effects, examples of the gate driver 102 include a chatter suppression circuit 116. In some examples, the gate driver 102 includes a chatter suppression circuit 116 for each respective input pad 110. The chatter suppression circuit 116 may be coupled between each respective input pad 112 and the logic circuit 104. Although the gate driver 102 may include multiple chatter suppression circuits 116, operation of only one chatter suppression circuit 116 is described herein for the sake of simplicity.

In at least some examples, the chatter suppression circuit 116 monitors a value provided at a voltage supply (VDD) pad 118 and, responsive to determining that the value provided at the VDD pad 118 has decreased more than a threshold amount, determines that noise exists in the ground voltage potential. Responsive to determining that noise exists in the ground voltage potential, the chatter suppression circuit 116 ignores a decrease in value of an input signal provided at an input pad 112. Ignoring the change in value of the input signal while the noise exists in the ground voltage potential causes the chatter suppression circuit 116 to suppress or otherwise mitigate glitches, chatter, or other adverse effects in an output provided at the output pad 112 based on the input signal provided at the input pad 110.

In at least some examples, responsive to determining that the value provided at the VDD pad 118 has increased more than a threshold amount, the chatter suppression circuit 116 determines that noise exists in the ground voltage potential. Responsive to determining that noise exists in the ground voltage potential, the chatter suppression circuit 116 ignores an increase in value of the input signal provided at the input pad 110. Ignoring the change in value of the input signal while the noise exists in the ground voltage potential causes the chatter suppression circuit 116 to suppress or otherwise mitigate glitches, chatter, or other adverse effects in the output provided at the output pad 112 based on the input signal provided at the input pad 110.

Figure 2:
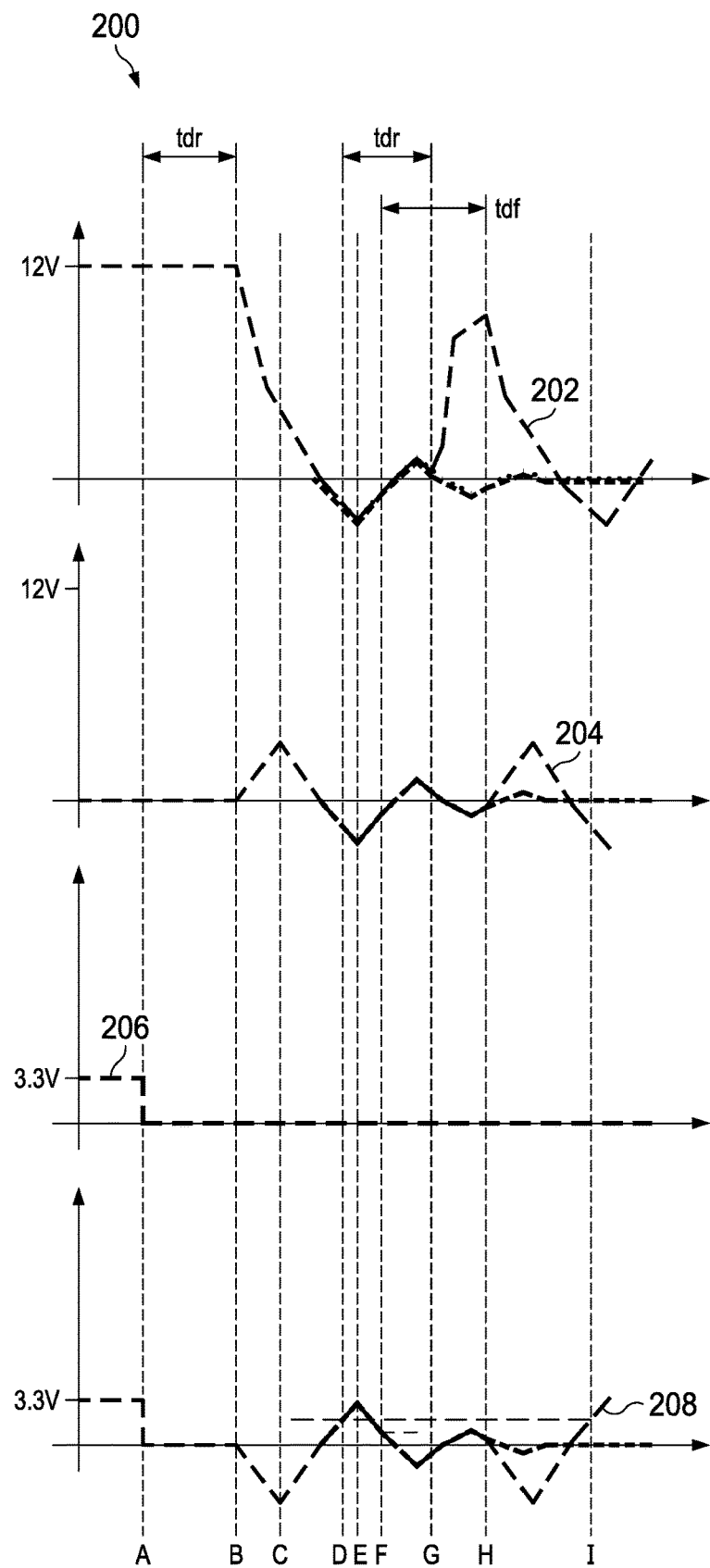
FIG. 2 is a timing diagram of signals that may be provided in an electronic device, in accordance with various examples.

FIG. 2 is a timing diagram 200 of signals that may be provided in an electronic device, in accordance with various examples. In some examples, the electronic device is the electronic device 100 such that the signal of the timing diagram 200 may be provided to, or provided by, the electronic device 100. The timing diagram 200 includes a signal 202 provided at the output pad 112, a signal 204 provided at the ground pad 114, a signal 206 provided at an input signal provided at the input pad 110, and a signal 208 that is a result of subtracting the signal 204 from the signal 206. Each signal of the timing diagram 200 is shown on a vertical axis representative of voltage (V) and a horizontal axis representative of time.

At time A, signal 204 transitions from a logical high value to a logical low value. Following a propagation delay, indicated as tdr, at time B the signal 202 begins to decrease in value responsive to the transition in value of the signal 204. Responsive to the signal 202 decreasing in value, current flows from the output pad 112 to the ground pad 114. A parasitic inductance of, or associated with, the ground pad 114, or a bond with coupled to the ground pad 114, causes a voltage of the signal 204 to increase in value. From time C to time E, signal 204 decreases in value, continuing from time E in a resonant ringing manner until reaching approximately the value of signal 204 prior to time B. In at least some examples, a voltage differential between the signal 204 and the signal 206, as shown by the signal 208, is sufficient at time D to cause a glitch, chatter, or other adverse effect in the signal 202 (e.g., such as a false on or high pulse). For example, at time D a voltage of the signal 208 may exceed a threshold (Vth) of, or associated with, the logic circuit 104. Responsive to the value of the signal 208 equaling, or exceeding, Vth1, at time D and following a propagation delay of tdr, the gate driver 102 causes the signal 202 to increase in value from a time G. At a time F, the value of the signal 208 decreases below a second threshold, Vth2, causing the signal 202 to decrease in value, following a propagation delay, indicated as tdf, at time H. At time H, the decrease in value of signal 202 causes current flows from the output pad 112 to the ground pad 114, causing the voltage of the signal 204 to increase in value as described above at time C, thus beginning a chatter cycle in which the signals of the timing diagram 200 substantially repeat their transient behavior as shown between times D and I. The chatter cycle, or ringing, may cause multiple glitches, chatter, or other adverse effects in the signal 202, adversely affecting operation of the electronic device 100.

Figure 3:
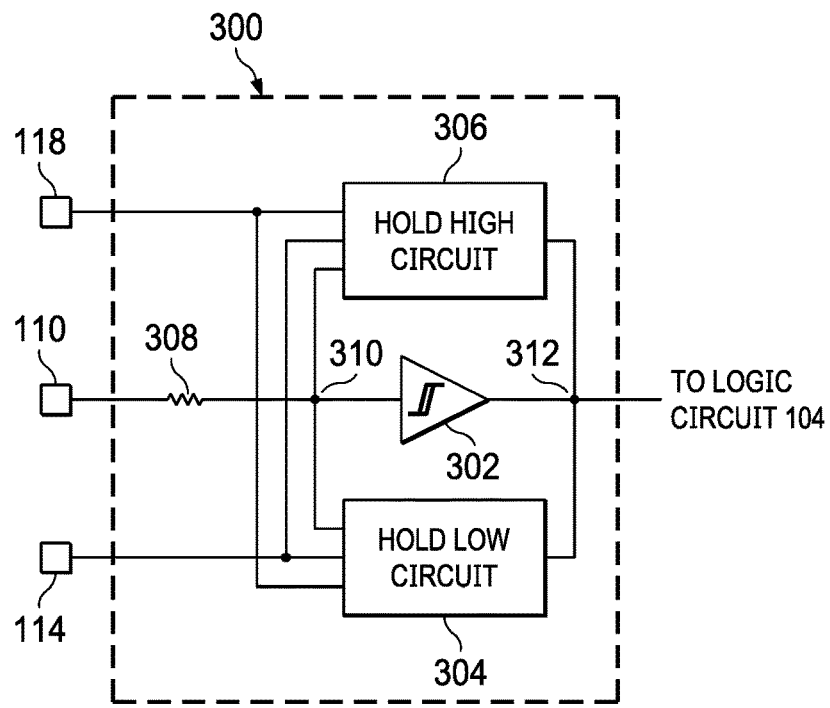
FIG. 3 is a block diagram of a chatter suppression circuit, in accordance with various examples.

FIG. 3 is a block diagram of a chatter suppression circuit 300, in accordance with various examples. In some examples, the chatter suppression circuit 300 is implemented as the chatter suppression circuit 116, as described above. In some examples, the chatter suppression circuit 300 includes a Schmitt trigger 302, a hold low circuit 304, and a hold high circuit 306. An input resistance, indicated as a resistor 308, may exist between the input pad 110 and a node 310. While shown in FIG. 3 as a physical component, in at least some examples the resistor 308 is a parasitic resistance that exists inherently at the input pad 110 and/or between the input pad 110 and the node 310. The hold low circuit 304 is coupled to the ground pad 114, the VDD pad 118, the node 310, and a node 312. The Schmitt trigger 302 has an input coupled to the node 310 and an output coupled to the node 312. The hold high circuit 306 is coupled to the VDD pad 118, the node 310, and a node 312.

In an example of operation of the chatter suppression circuit 300, the hold low circuit 304 monitors the voltage provided at the VDD pad 118 and, responsive to determining that the value provided at the VDD pad 118 has decreased more than a threshold amount, determines that noise exists in the ground voltage potential at provided at the ground pad 114. Responsive to determining that noise exists in the ground voltage potential, the hold low circuit 304 prevents a decrease in value of a signal provided at the input pad 110 from causing a value of an output signal of the Schmitt trigger 302 to change in value. Preventing the decrease in value of the signal provided at the input pad 110 from causing the value of the output signal of the Schmitt trigger 302 to change in value causes the chatter suppression circuit 300 to suppress or otherwise mitigate glitches, chatter, or other adverse effects in the output signal of the Schmitt trigger 302 based on the input signal provided at the input pad 110.

In another example of operation of the chatter suppression circuit 300, the hold high circuit 306 monitors the voltage provided at the VDD pad 118 and, responsive to determining that the value provided at the VDD pad 118 has increased more than a threshold amount, determines that noise exists in the ground voltage potential at provided at the ground pad 114. Responsive to determining that noise exists in the ground voltage potential, the hold high circuit 306 prevents an increase in value of the signal provided at the input pad 110 from causing the value of the output signal of the Schmitt trigger 302 to change in value. Preventing the increase in value of the signal provided at the input pad 110 from causing the value of the output signal of the Schmitt trigger 302 to change in value causes the chatter suppression circuit 300 to suppress or otherwise mitigate glitches, chatter, or other adverse effects in the output signal of the Schmitt trigger 302 based on the input signal provided at the input pad 110.

Figure 4:
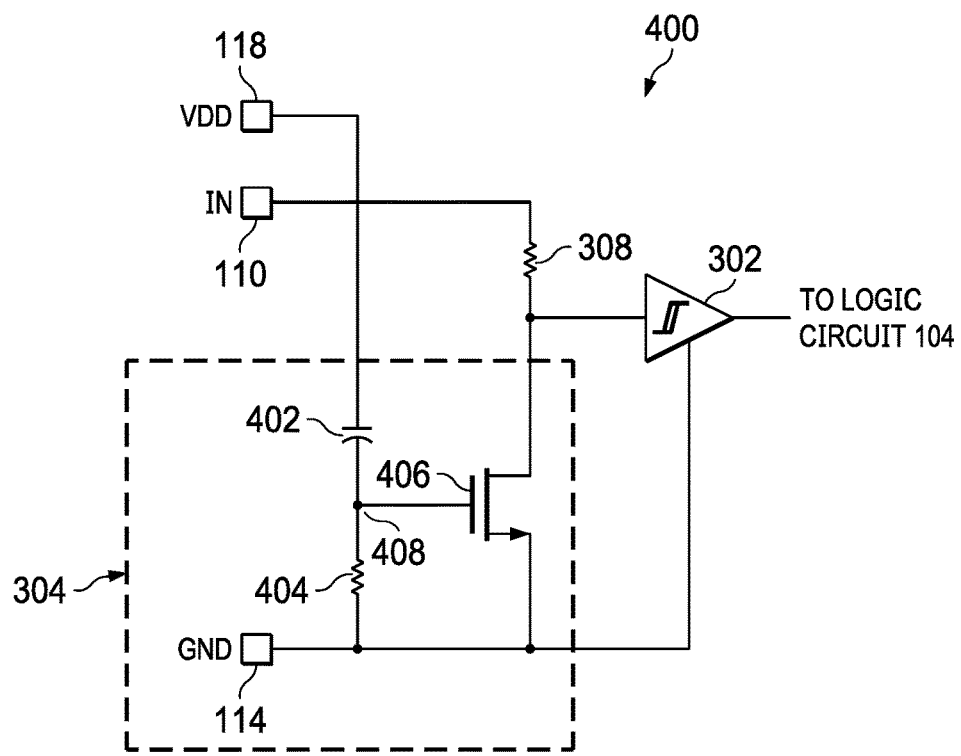
FIG. 4 is a circuit diagram of a chatter suppression circuit, in accordance with various examples.

FIG. 4 is a circuit diagram of a circuit 400, in accordance with various examples. In some examples, the circuit 400 is a partial representation of the chatter suppression circuit 300, including the hold low circuit 304, as described above. In some examples, the circuit 400 includes a capacitor 402, a resistor 404, and a transistor 406. In an example architecture of the circuit 400, the capacitor 402 is coupled between the VDD pad 118 and a node 408. The resistor 404 is coupled between the node 408 and the ground pad 114. The transistor 406 has a gate coupled to the node 408, a drain coupled to the input pad 110, and a source coupled to the ground pad 114. The drain of the transistor 406 is coupled to the input of the Schmitt trigger 302.

In an example of operation of the circuit 400, the node 408 is capacitively coupled to the VDD pad 118 via the capacitor 402. The transistor 406 conducts between the input pad 110 and the ground pad 114, causing a signal provided at the input pad 110 to be provided to the Schmitt trigger 302, responsive to a value of a signal provided at the node 408 exceeding a threshold value of the transistor 406. For example, responsive to a rate of change (e.g., increase) of VDD exceeding a programmed rate, the transistor 406 may turn on, conducting between its drain and source terminals and pulling down a value of a signal provided at the input pad 110 to prevent an increase in value of the signal provided at the input pad 110 from causing the output signal of the Schmitt trigger 302 to change in value. The programmed rate may be determined according to a capacitance value of the capacitor 402 and a resistance value of the resistor 404. In an example, the capacitor 402 has a capacitance of about 40 femtofarads and the resistor 404 has a resistance of about 250 kiloohms.

Figure 5:
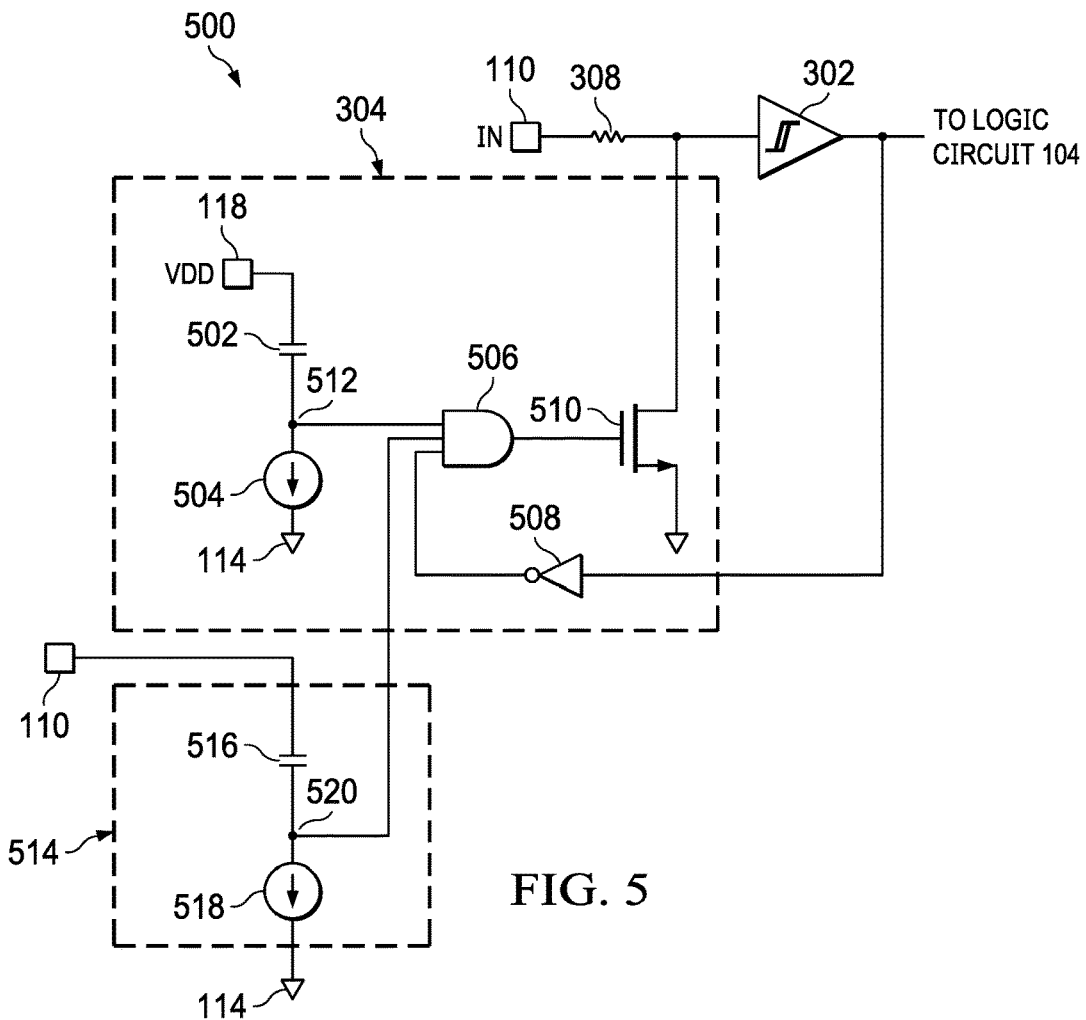
FIG. 5 is a circuit diagram of a chatter suppression circuit, in accordance with various examples.

FIG. 5 is a circuit diagram of a circuit 500, in accordance with various examples. In some examples, the circuit 500 is a partial representation of the chatter suppression circuit 300, including the hold low circuit 304, as described above. In some examples, the circuit 500 includes a capacitor 502, a current source 504, a logic circuit 506, a logic circuit 508, and a transistor 510. In an example architecture of the circuit 500, the capacitor 502 is coupled between the VDD pad 118 and a node 512. The current source 504 is coupled between the node 512 and the ground pad 114. The logic circuit 506 has a first input coupled to the node 512. In some examples, the logic circuit 506 is an AND logic circuit or otherwise provides the functionality of an AND logical operation. The logic circuit 508 is coupled between the output of the Schmitt trigger 302 and a second input of the logic circuit 506. In some examples, the logic circuit 508 is an inverter or otherwise provides the functionality of an inverting logical operation. The transistor 510 has a gate coupled to an output of the logic circuit 506, a drain coupled to the input pad 110, and a source coupled to the ground pad 114. The drain of the transistor 406 is coupled to the input of the Schmitt trigger 302. In some examples, although not shown in FIG. 5, a cascode device (e.g., transistor) is coupled between the drain of the transistor 510 and the input pad 110 and has a gate terminal at which a signal exceeding a threshold voltage of the cascode device is provided.

In an example of operation of the circuit 500, the node 512 is capacitively coupled to the VDD pad 118 via the capacitor 502. Responsive to a voltage provided at the node 512 exceeding a threshold value of the logic circuit 506, and while the output signal of the Schmitt trigger 302 has a deasserted value (e.g., logical low, such that an output of the logic circuit 508 has an asserted, or logic high, value), the logic circuit 506 provides an output signal having an asserted value. The transistor 510 conducts between the input pad 110 and the ground pad 114, causing a signal provided at the input pad 110 to be provided to the Schmitt trigger 302, responsive to a value of a signal provided at the gate of the transistor 510 from exceeding a threshold value of the transistor 510. For example, responsive to a rate of change (e.g., increase) of VDD exceeding a programmed rate, the asserted signal provided by the logic circuit 506 may cause the transistor 510 to turn on, conducting between its drain and source terminals and pulling down a value of a signal provided at the input pad 110 to prevent an increase in value of the signal provided at the input pad 110 from causing the output signal of the Schmitt trigger 302 to change in value. The programmed rate may be determined according to a capacitance value of the capacitor 502 and a value of a current conducted by the current source 504. In some examples, the capacitor 502 and the current source 504 function as a high pass filter.

In some examples, the circuit 500 considers values presented at multiple pads in controlling the transistor 510, and thereby a value provided to the Schmitt trigger 302. For example, the circuit 500 includes a sub-circuit 514. The sub-circuit 514 includes a capacitor 516 and a current source 518. The capacitor 516 capacitively couples an input pad 110 to a node 520 and the current source 518 is coupled between the node 520 and the ground pad 114. The sub-circuit 514 is coupled at the node 520 to another input (e.g., a third input, as shown in FIG. 5) of the logic circuit 506. Responsive to a voltage provided at the node 520 exceeding the threshold value of the logic circuit 506, and while the output signal of the Schmitt trigger 302 has a deasserted value and the voltage provided at the node 512 exceeds the threshold value of the logic circuit 506, the logic circuit 506 provides an output signal having an asserted value. In this way, the circuit 500 monitors both the VDD pad 118 and the input pad 110 for changes in value to determine whether noise is affecting a value of a signal provided at the ground pad 114. In various examples of the circuit 500, the sub-circuit 514 may be replicated and coupled to a different respective input pad 110 of the multiple input pads 110 and another input of the logic circuit 506 such that multiple input pads 110 are considered along with the VDD pad 118 in controlling the transistor 510. For example, some implementations of the circuit 500 may include a sub-circuit 514 for each respective input pad 110 of the gate driver 102.

Figure 6:
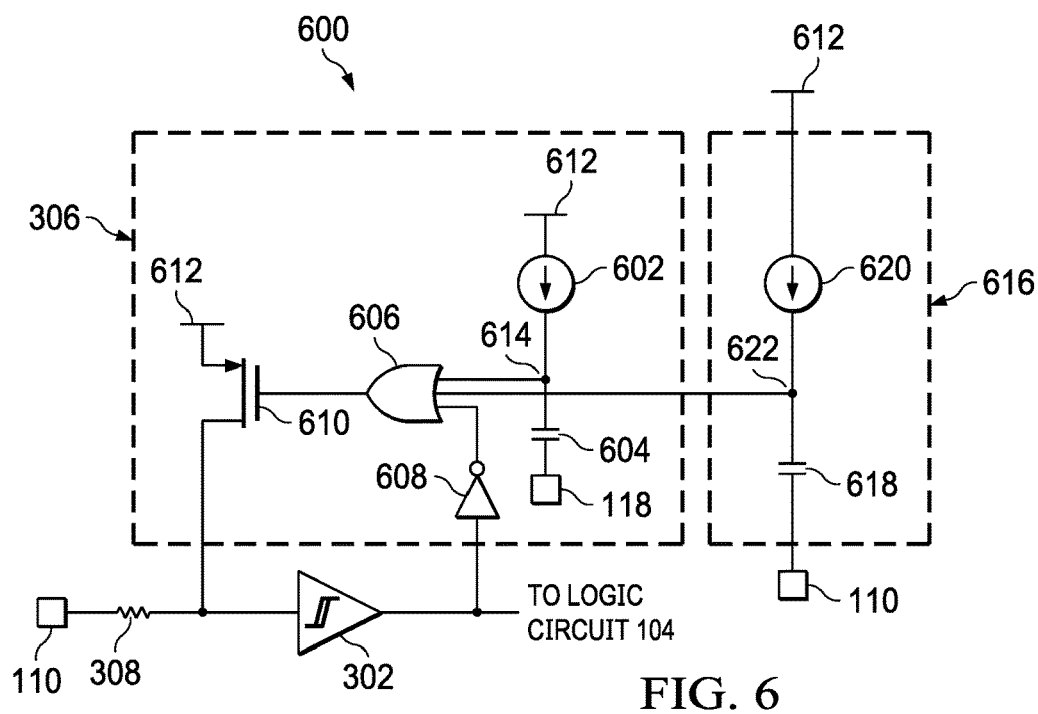
FIG. 6 is a circuit diagram of a chatter suppression circuit, in accordance with various examples.

FIG. 6 is a circuit diagram of a circuit 600, in accordance with various examples. In some examples, the circuit 600 is a partial representation of the chatter suppression circuit 300, including the hold high circuit 306, as described above. In some examples, the circuit 600 includes a current source 602, a capacitor 604, a logic circuit 606, a logic circuit 608, and a transistor 610. In an example architecture of the circuit 600, the current source 602 is coupled between a node 612 and a node 614. The capacitor 604 is coupled between the node 614 and the VDD pad 118. The logic circuit 606 has a first input coupled to the node 614. In some examples, the logic circuit 606 is an OR logic circuit or otherwise provides the functionality of an OR logical operation. The logic circuit 608 is coupled between the output of the Schmitt trigger 302 (e.g., the node 312) and a second input of the logic circuit 606. In some examples, the logic circuit 608 is an inverter or otherwise provides the functionality of an inverting logical operation. The transistor 610 has a gate coupled to an output of the logic circuit 606, a source coupled to the node 612, and a drain coupled to the input of the Schmitt trigger 302 (e.g., the node 310).

In an example of operation of the circuit 600, the node 612 is capacitively coupled to the VDD pad 118 via the capacitor 604. Responsive to a voltage provided at the node 614 exceeding a threshold value of the logic circuit 606, or the output signal of the Schmitt trigger 302 having a deasserted value (e.g., logical low, such that an output of the logic circuit 608 has an asserted, or logic high, value), the logic circuit 606 provides an output signal having an asserted value. The transistor 610 conducts between the node 612 and the input of the Schmitt trigger 302, causing a signal provided at the node 612 to be provided to the Schmitt trigger 302, responsive to a value of a signal provided at the gate of the transistor 610 being less than a threshold value of the transistor 510. For example, responsive to a rate of change (e.g., decrease) of VDD exceeding a programmed rate and the output signal of the Schmitt trigger 302 having an asserted value, a deasserted signal is provided by the logic circuit 606 to cause the transistor 610 to turn on, conducting between its drain and source terminals and pulling up a value of a signal provided at the input pad 110 to prevent a decrease in value of the signal provided at the input pad 110 from causing the output signal of the Schmitt trigger 302 to change in value. The programmed rate may be determined according to a value of a current conducted by the current source 602 and a capacitance value of the capacitor 604. In some examples, the current source 602 and the capacitor 604 function as a low pass filter.

In some examples, the circuit 600 considers values presented at multiple pads in controlling the transistor 610, and thereby a value provided to the Schmitt trigger 302. For example, the circuit 600 includes a sub-circuit 616. The sub-circuit 616 includes a capacitor 618 and a current source 620. The capacitor 618 capacitively couples an input pad 110 to a node 622 and the current source 620 is coupled between the node 612 and the node 622. The sub-circuit 616 is coupled at the node 622 to another input (e.g., a third input, as shown in FIG. 5) of the logic circuit 606. Responsive to a voltage provided at the node 622 exceeding the threshold value of the logic circuit 606, the output signal of the Schmitt trigger 302 having a deasserted value, or the voltage provided at the node 614 exceeds the threshold value of the logic circuit 606, the logic circuit 606 provides an output signal having an asserted value. In this way, the circuit 600 monitors both the VDD pad 118 and the input pad 110 for changes in value to determine whether noise is affecting a value of a signal provided at the ground pad 114. In various examples of the circuit 600, the sub-circuit 616 may be replicated and coupled to a different respective input pad 110 of the multiple input pads 110 and another input of the logic circuit 606 such that multiple input pads 110 are considered along with the VDD pad 118 in controlling the transistor 610. For example, some implementations of the circuit 600 may include a sub-circuit 616 for each respective input pad 110 of the gate driver 102.

Figure 7:
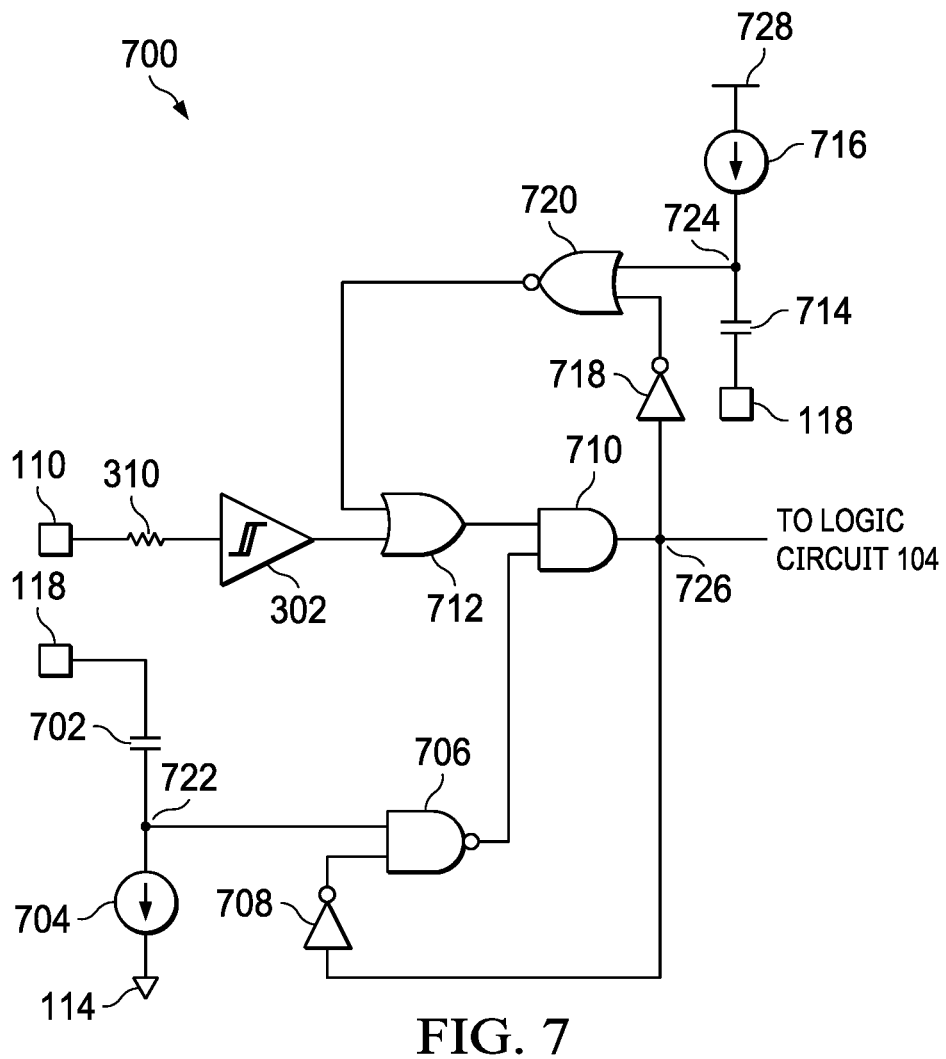
FIG. 7 is a is a circuit diagram of a chatter suppression circuit, in accordance with various examples.

FIG. 7 is a circuit diagram of a chatter suppression circuit 700, in accordance with various examples. In some examples, the circuit 700 is suitable for implementation as the chatter suppression circuit 300, including the hold low circuit 304, and the hold high circuit 306, as described above. In some examples, the circuit 700 includes a capacitor 702, a current source 704, a logic circuit 706, a logic circuit 708, a logic circuit 710, a logic circuit 712, a capacitor 714, a current source 716, a logic circuit 718, and a logic circuit 720.

In an example architecture of the circuit 700, the capacitor 702 is coupled between the VDD pad 118 and a node 722. The current source 704 is coupled between the node 722 and the ground pad 114. The logic circuit 706 has a first input coupled to the node 722. In some examples, the logic circuit 706 is a NAND logic circuit or otherwise provides the functionality of a NAND (e.g., inverting AND) logical operation. The logic circuit 708 is coupled between an output of the logic circuit 710 and a second input of the logic circuit 706. In some examples, the logic circuit 708 is an inverter or otherwise provides the functionality of an inverting logical operation. The logic circuit 710 has a first input coupled to an output of the logic circuit 712, a second input coupled to the output of the logic circuit 706, and an output coupled to a node 726. The logic circuit 712 has a first input coupled to an output of the Schmitt trigger 302. The capacitor 714 is coupled between the VDD pad 118 and a node 724. The current source 716 is coupled between a node 728 at which a supply voltage is provided and the node 724. The logic circuit 720 has a first input coupled to the node 724. In some examples, the logic circuit 720 is a NOR logic circuit or otherwise provides the functionality of a NOR (e.g., inverting OR) logical operation. The logic circuit 718 is coupled between the node 726 and a second input of the logic circuit 720. In some examples, the logic circuit 718 is an inverter or otherwise provides the functionality of an inverting logical operation. An output of the logic circuit 720 is coupled to a second input of the logic circuit 712.

In an example of operation of the circuit 700, the node 722 is capacitively coupled to the VDD pad 118 via the capacitor 702 and the node 724 is capacitively coupled to the VDD pad 118 via the capacitor 714. Based on programmed bias currents of the current source 704 and the current source 716, as well as a value of a signal provided at the input pad 110, the circuit 700 is configured to provide at output at the node 726 that mitigate the existence of glitch or chatter in the signal provided at the node 726 due to the noise on the ground plane. In at least some examples, the logic circuits of the circuit 700 are configured to provide the signal at the node 726 according to a logical function of $V726=(\overline{V722}+V726)+(V302|(\overline{V724}|V726))$, where V726 is a value of a signal provided at the node 726, V722 is a value of a signal provided at the node 722, V302 is a value of a signal provided by the Schmitt trigger 302, and V724 is a value of a signal provided at the node 724.

Figure 8A:
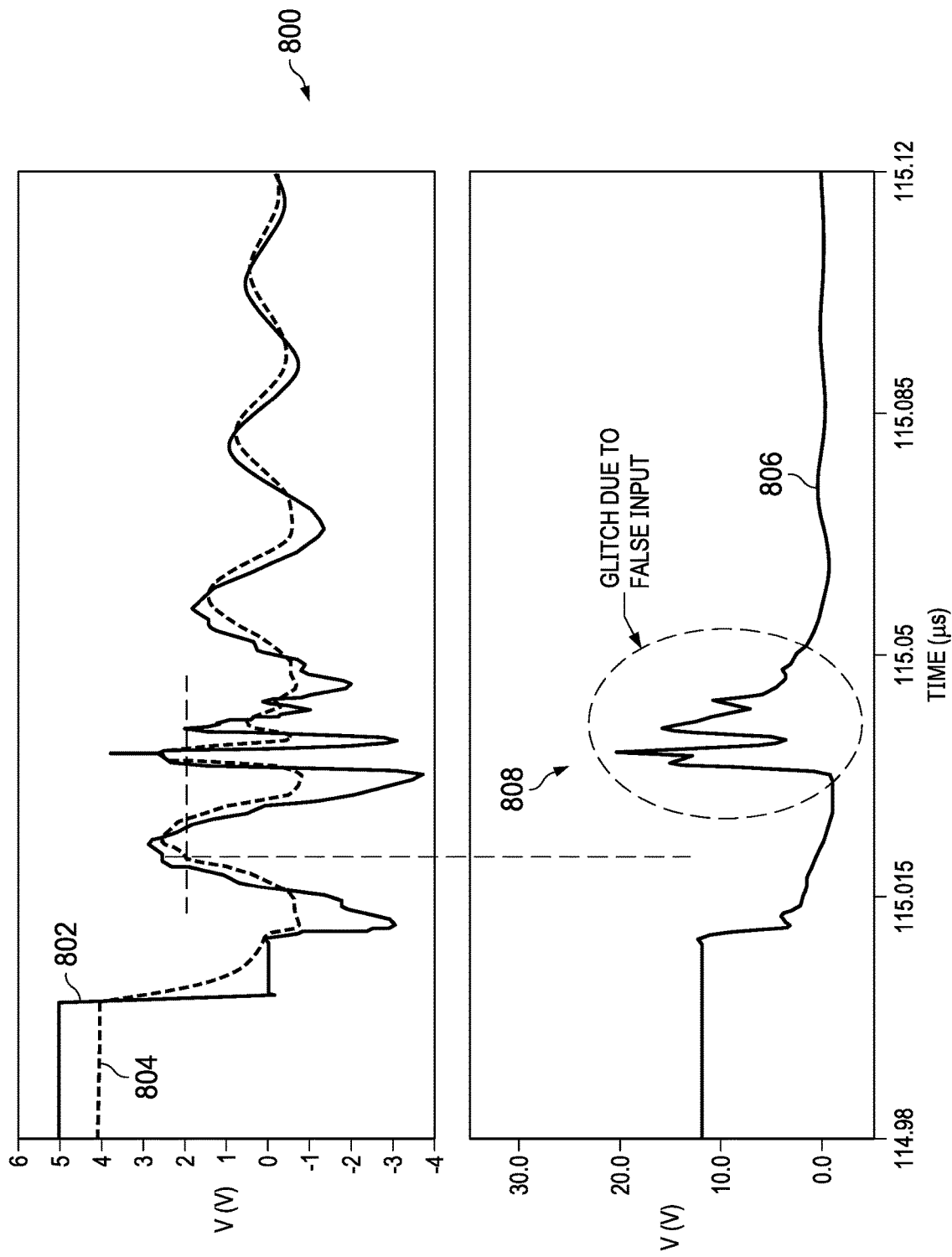
FIG. 8A is a timing diagram of signals in an electronic device, in accordance with various examples.

FIGS. 8A and 8B are timing diagrams 800 and 810, respectively, of signals in an electronic device, in accordance with various examples. In some examples, the electronic device is the electronic device 100 such that the signal of the timing diagram 200 may be provided to, or provided by, the electronic device 100. Each of the timing diagram 800 and the timing diagram 810 includes a signal 802 provided at the input pad 110, a signal 804 provided at an input of the Schmitt trigger 302, a signal 806 provided at the output pad 112, and a signal 808 provided at the VDD pad 118. Each signal of the timing diagrams 800 and 810 is shown on a vertical axis representative of voltage (V) and a horizontal axis representative of time in units of microseconds (us).

The timing diagram 800 shows an example of signals in the electronic device 100 without chatter suppression, such as provided by the chatter suppression circuit 300. The signal 808 may be shown with reference to the ground voltage potential as provided at the ground pad 114. For example, the signal 808 may increase in value if VDD remains substantially unchanging and the ground voltage potential decreases in value. Similarly, the signal 808 may decrease in value if VDD remains substantially unchanging and the ground voltage potential increases in value.

As shown by the timing diagram 800, a value, and change in value, of the signal 804 may approximately track that of the signal 802 in the absence of the chatter suppression circuit 300. Responsive to a change in value of the ground voltage potential, signals referenced to the ground voltage potential (e.g., such as the signals 802, 804, 808) may change in value in a direction opposite in polarity to that of the change in value of the ground voltage potential. Responsive to signal 804 exceeding Vth, a false input may be registered by the Schmitt trigger 302, thereby causing a glitch in the signal 806 and adversely affecting operation of the electronic device.

The timing diagram 810 shows an example of signals in the electronic device 100 with chatter suppression, such as provided by the chatter suppression circuit 300. As shown by the timing diagram 810, a value, and change in value, of the signal 804 may approximately track that of the signal 802 in the absence of the chatter suppression circuit 300. Responsive to a change in value of the ground voltage potential, signals referenced to the ground voltage potential (e.g., such as the signals 802, 808) may change in value in a direction opposite in polarity to that of the change in value of the ground voltage potential. However, the chatter suppression circuit 300 may prevent the signal 804 from tracking the signal 802, as described above with respect to the timing diagram 800. Preventing the signal 804 from tracking the signal 802 may prevent the signal 804 from exceeding Vth and causing a false input to be registered by the Schmitt trigger 302, or a glitch to be caused in the signal 806, thereby improving operation of the electronic device.

Figure 9:
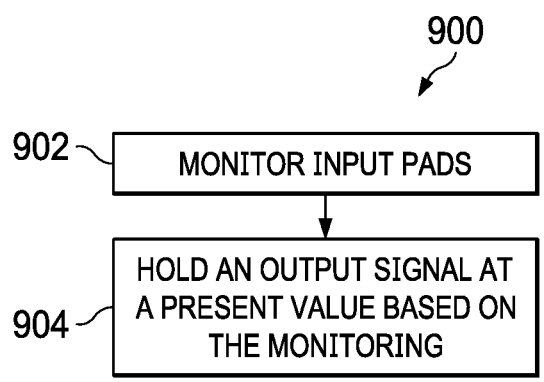
FIG. 9 is a flow diagram of operation of a chatter suppression circuit, in accordance with various examples.

FIG. 9 is a flow diagram of a method 900 for signal chatter mitigation, in accordance with various examples. In some examples, the method 900 may be implemented by a circuit, such as the chatter suppression circuit 116, described above herein. In other examples, the method 900 may be implemented by a processing device, an analog circuit, a digital circuit, or any suitable combination thereof. The method 900 provides for monitoring a change in voltage at a pad of a circuit and, responsive to a change in voltage at the pad, preventing a value of an output signal of the integrated circuit from changing, thereby mitigating signal chatter. For example, one or more voltage input pads are monitored as a proxy for the ground voltage, to which voltage inputs and outputs are referenced. Based on a voltage at an input pad changing more than a threshold amount, or voltages at multiple respective input pads changing in a same direction (e.g., increase or decrease), such as more than a threshold amount, a determination is made that noise exists on the ground plane and is causing variation in value of a signal provided at a ground pad of the integrated circuit. Responsive to this determination, the integrated circuit is prevented from changing a value of the output signals of the integrated circuit for a programmed amount of time. In some examples, the programmed amount of time is determined according to a cycle time of noise of the package housing an integrated circuit, such as the gate driver 102 that includes the chatter suppression circuit 116. The cycle time of the noise of the package may be determined based on resonance parameters of bond wires that couple pads of the integrated circuit to lead pins of the package. In some examples of the chatter suppression circuit 116, the programmed amount of time is about 10 nanoseconds.

At operation 902, input pads are monitored. The monitoring may detect a change in value provided at the input pad exceeding a threshold or programmed amount. In some examples, a single input pad is monitored. The input pad may be a voltage supply pad, such as the VDD pad 118, as described above. The input pad may be monitored such that an asserted signal is provided responsive to the determination that the value provided at the input pad has changed greater than the programmed amount. In other examples, multiple input pads may be monitored. For example, the voltage supply pad and one or more data input pads may be monitored. In some examples, less than all data input pads are monitored, while in other examples all data input pads are monitored. In an example, the input pads may be monitored such that an asserted signal is provided responsive to a determination that the value provided at each of the monitored input pads has changed greater than the programmed amount. The programmed amount may be separately programmed for each monitored input pad such that different programmed amounts are for different monitored input pads. In another example, the input pads may be monitored such that an asserted signal is provided responsive to a determination that each of the monitored input pads is changing in a same polar direction (e.g., positive/increase or negative/decrease). In another example, the input pads may be monitored such that an asserted signal is provided responsive to a determination that at least a programmed number of the monitored input pads are changing in a same polar direction (e.g., positive/increase or negative/decrease). The asserted signal may be representative of a determination that noise exists on the ground plane and is causing variation in value of signals received at at least some of the monitored pads.

At operation 904, an output signal of the integrated circuit is held at a present value based on the monitoring. For example, responsive to providing of the asserted signal at operation 902, an output value of the integrated circuit is held at its present value. The output value of the integrated circuit may be held irrespective of a perceived change in value of an input signal on which the output signal is at least partially based, and the change of which would normally cause the output value to change. For example, responsive to assertion of the signal at operation 902, an output signal having a logical low value prior to a determination of a change in value at the input pads and assertion of the signal at operation 902 may be held low despite a perceived change in value of an input signal that would otherwise cause the output signal to have a logical high value. Similarly, responsive to assertion of the signal at operation 902, an output signal having a logical high value prior to the determination of the change in value at the input pads and assertion of the signal at operation 902 may be held high despite a perceived change in value of an input signal that would otherwise cause the output signal to have a logical low value.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end user and/or a third party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

The phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A circuit, comprising:
   a capacitor having first and second capacitor terminals, wherein the first capacitor terminal is coupled to a voltage supply terminal;
   a transistor having a control terminal and first and second current terminals, wherein the first current terminal is coupled to a ground terminal, the second current terminal is coupled to an input terminal, and the control terminal is coupled to the second capacitor terminal;
   a logic circuit having first, second, and third logic inputs and a logic output, wherein the first logic input is coupled to the second capacitor terminal, and the logic output is coupled to the control terminal; and
   a Schmitt trigger having a Schmitt trigger input and a Schmitt trigger output, wherein the Schmitt trigger input is coupled to the second current terminal.

2. The circuit of claim 1, further comprising a current source coupled between the second capacitor terminal and the ground terminal.

3. The circuit of claim 2, wherein the logic circuit is a first logic circuit, the logic output is a first logic output, and the circuit is further comprising
   a second logic circuit having a fourth logic input and a second logic output, wherein the fourth logic input is coupled to the Schmitt trigger output, and the second logic output is coupled to the second logic input.

4. The circuit of claim 3, wherein the first logic circuit performs an AND logical operation, and the second logic circuit is an inverter.

5. The circuit of claim 1, further comprising a resistor coupled between the second current terminal and the input terminal.

6. The circuit of claim 1, wherein the circuit is configured to couple the Schmitt trigger input to the ground terminal responsive to an increase in voltage at the voltage supply terminal.

7. The circuit of claim 6, wherein the increase in voltage at the voltage supply terminal is caused by a decrease in voltage at the ground terminal.

8. The circuit of claim 6, wherein the Schmitt trigger input is coupled to the ground terminal responsive to an increase in a voltage at the control terminal.

* * * * *